United States Patent
Kim

(10) Patent No.: US 8,278,754 B2
(45) Date of Patent: Oct. 2, 2012

(54) METAL LINE IN SEMICONDUCTOR DEVICE AND METHOD FOR FORMING THE SAME

(75) Inventor: Min-Seok Kim, Siheung-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 423 days.

(21) Appl. No.: 12/582,849

(22) Filed: Oct. 21, 2009

(65) Prior Publication Data

US 2010/0117233 A1 May 13, 2010

(30) Foreign Application Priority Data

Nov. 13, 2008 (KR) .................. 10-2008-0112653

(51) Int. Cl.
*H01L 23/48* (2006.01)
*H01L 23/52* (2006.01)
*H01L 29/40* (2006.01)

(52) U.S. Cl. .................. 257/737; 257/751; 438/653

(58) Field of Classification Search .................. 257/737, 257/751; 438/653
See application file for complete search history.

(56) References Cited

U.S. PATENT DOCUMENTS 6,144,100 A 11/2000 Shen et al.
2002/0056910 A1* 5/2002 Howell et al. .................. 257/737

\* cited by examiner

*Primary Examiner* — Phuc Dang
(74) *Attorney, Agent, or Firm* — Sherr & Jiang, PLLC

(57) ABSTRACT

A method includes forming a buffer lower metal line over a semiconductor substrate for absorbing an external impact, forming a pre-metal-dielectric layer which covers the buffer lower metal line, the pre-metal-dielectric layer having a via hole formed therein to expose a portion of the buffer lower metal line, forming a seed layer over a surface of the pre-metal-dielectric layer having the via hole formed therein, forming polyimide which exposes the via hole and the seed layer formed over the pre-metal-dielectric layer in the vicinity of the via hole, growing an upper metal line over the exposed seed layer, subjecting the semiconductor substrate having the upper metal line formed thereon to a thermal process, removing the polyimide by dry etching, and bonding a bonding portion onto the upper metal line.

7 Claims, 9 Drawing Sheets

METAL LINE IN SEMICONDUCTOR DEVICE AND METHOD FOR FORMING THE SAME

The present application claims priority under 35 U.S.C. 119 to Korean Patent Application No. 10-2008-0112653 (filed on Nov. 13, 2009), which is hereby incorporated by reference in its entirety.

BACKGROUND

With integration density of semiconductor devices becoming higher and the semiconductor devices becoming smaller, a multi-layered line (wiring) structure is employed in semiconductor device fabrication. With the multi-layered line structure, formation of via holes and metal lines in turn becomes an important factor in semiconductor device fabrication.

Figure 1:
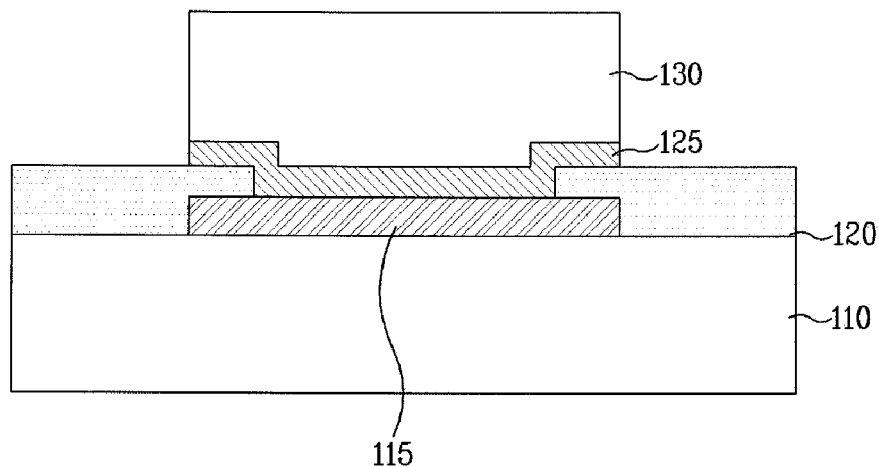

FIG. 1 illustrates a section of a metal line layer in a related high voltage semiconductor device. As shown in FIG. 1, the metal line layer includes a lower metal line 115 formed over a semiconductor substrate 110, an interlayer insulating film 120 exposing a portion of the lower metal line 115, a barrier layer 125 formed over the lower metal line 115 exposed thus, and an upper metal line 130 formed over the barrier layer 125.

During wire bonding on the upper metal line 130, physical damage can occur under the metal line layer in a device formed at an active region of the semiconductor substrate 110. In general, the thickness of AlCu used as the lower metal line is as thin as 4000 Å. An impact generated during wire bonding is directly transmitted to the device formed at the active region of the semiconductor substrate 110, to cause the damage.

SUMMARY

Embodiments relate to a metal line in a semiconductor device and a method for forming the same. Embodiments relate to a metal line in a semiconductor device and a method for forming the same which can prevent a high voltage device from suffering physical damage, minimize metal line resistance. Embodiments relate to improving reliability of the package and the metal line when a BOAC (Bonding On Active Circuit) is made.

Embodiments relate to a method for forming a metal line in a semiconductor device which may include forming a buffer lower metal line over a semiconductor substrate for absorbing an external impact, forming a pre-metal-dielectric layer which covers the buffer lower metal line, the pre-metal-dielectric layer having a via hole formed therein to expose a portion of the buffer lower metal line, forming a seed layer over a surface of the pre-metal-dielectric layer having the via hole formed therein, forming polyimide which exposes the via hole and the seed layer formed over the pre-metal-dielectric layer in the vicinity of the via hole, growing an upper metal line over the exposed seed layer, subjecting the semiconductor substrate having the upper metal line formed thereon to a thermal process, removing the polyimide by dry etching, and bonding a bonding portion onto the upper metal line.

Embodiments relate to a metal line in a semiconductor device which may include a buffer lower metal line formed over a semiconductor substrate for absorbing an external impact, a pre-metal-dielectric layer which covers the buffer lower metal line, the pre-metal-dielectric layer having a via hole formed therein to expose a portion of the buffer lower metal line, a seed layer formed over a surface of the pre-metal-dielectric layer in the via hole and in the vicinity of the via hole, and a bonding portion bonded onto the upper metal line. The buffer lower metal line has a thickness of 1 μm~2 μm.

The upper metal line may include a copper layer formed over the copper seed layer to have a thickness of 10 μm~20 μm, and a metal layer formed over the copper layer to have at least one of Ni, Pd and Au stacked thereon. The metal line may further include a metal barrier layer having at least one of Ta, TaN, TiW, and TiN stacked thereon for preventing metal from diffusing between the pre-metal-dielectric layer and the seed layer.

DRAWINGS

FIG. 1 illustrates a section of a metal line layer in a related high voltage semiconductor device.

Example FIGS. 2A~2L illustrate sections showing the steps of a method for fabricating a metal line in a semiconductor device in accordance with embodiments.

DESCRIPTION

Example FIGS. 2A~2L illustrate sections showing the steps of a method for fabricating a metal line in a semiconductor device in accordance with embodiments. Referring to example FIG. 2A, a buffer lower metal line 215 may be formed over a semiconductor substrate 210 for absorbing an external impact. The semiconductor substrate 210 can be divided into a device isolating region and an active region, wherein the lower metal line 215 is formed at the active region. The buffer lower metal line 215 may be formed of, for example, aluminum, copper, or an alloy of aluminum and copper.

Figure 2A:
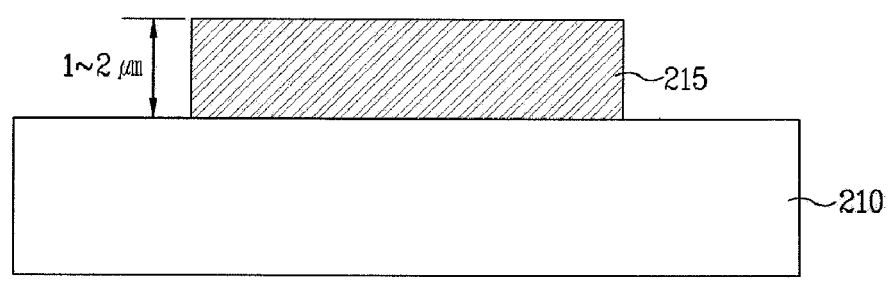

While metal lines may be formed with a thickness around 4000 Å in other layers, the buffer lower metal line 215 shown in example FIG. 2A may be formed to a thickness of 1 μm~2 μm for absorbing the external impact. Though not shown in example FIG. 2A, a first metal line connected to the buffer lower metal line 215 having a thickness of 5000 Å~6000 Å may be formed under the buffer lower metal line 215.

Figure 2B:
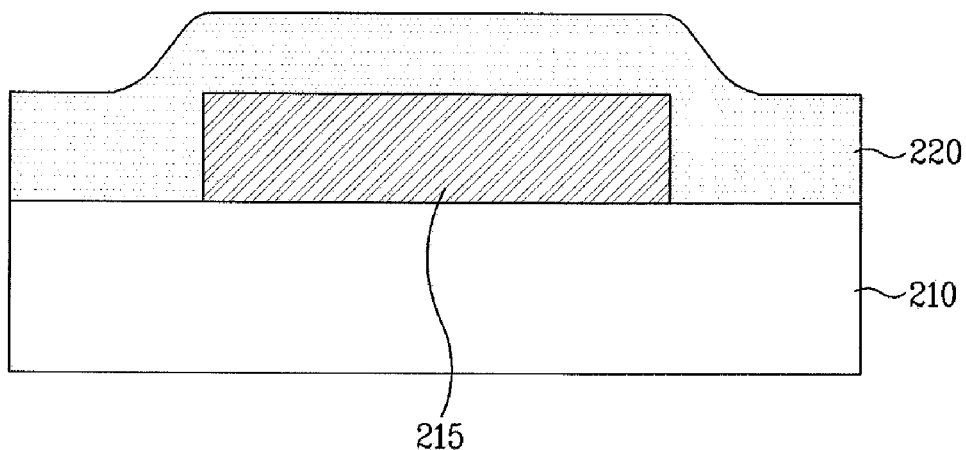

Referring to example FIG. 2B, an insulating film 220 may be formed over the semiconductor substrate 210 having the buffer lower metal line 215 formed thereon to cover the buffer lower metal line 215. The insulating film 220 can be an oxide film. Since the buffer lower metal line 215 is relatively thick, to pattern the buffer lower metal line 215 providing adequate spaces between the lines, a flattening process, for an example, CMP (Chemical Mechanical Polishing), can be omitted after formation of the insulating film 220.

Figure 2C:
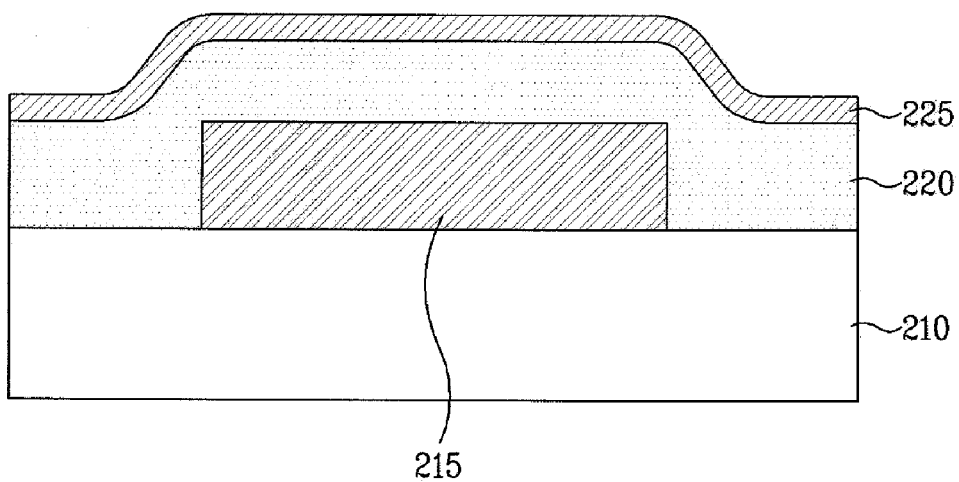

Referring to example FIG. 2C, a nitride film 225 may be formed over a surface of the insulating film 220. Hereafter, the nitride film 225 and the insulating film 220 will be referred to as a pre-metal-dielectric layer or pre-metal dielectric.

Figure 2D:
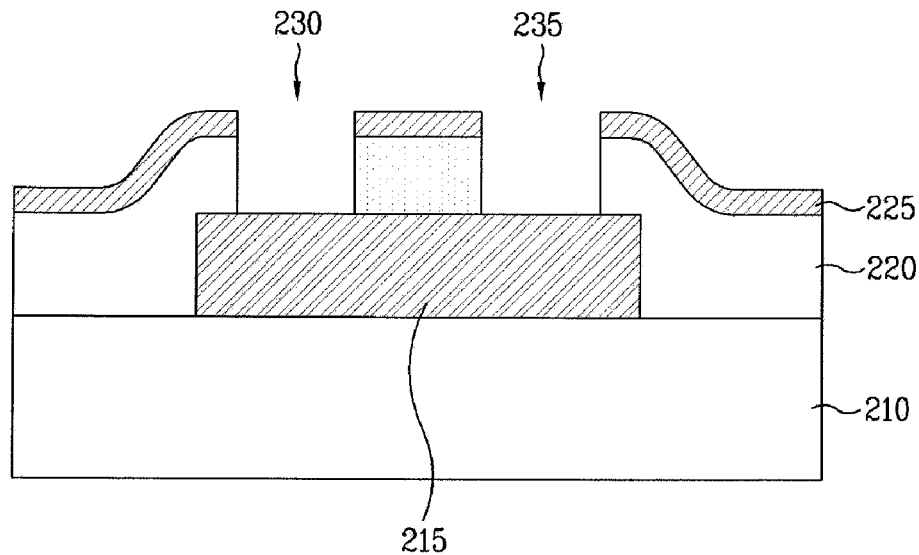

Referring to example FIG. 2D, the nitride film 225 and the insulating film 220 may be subjected to selective etching to form at least one via hole 230 and/or 235, which exposes a portion of the buffer lower metal line 215. For an example, the nitride film 225 may be subjected to photolithography to form a photoresist pattern. The nitride film 225 and the insulating film 220 may be etched in succession by using the photoresist pattern as a etch mask, to form at least one via hole 230 and/or 235 which exposes a portion of the buffer lower metal line 215.

Figure 2E:
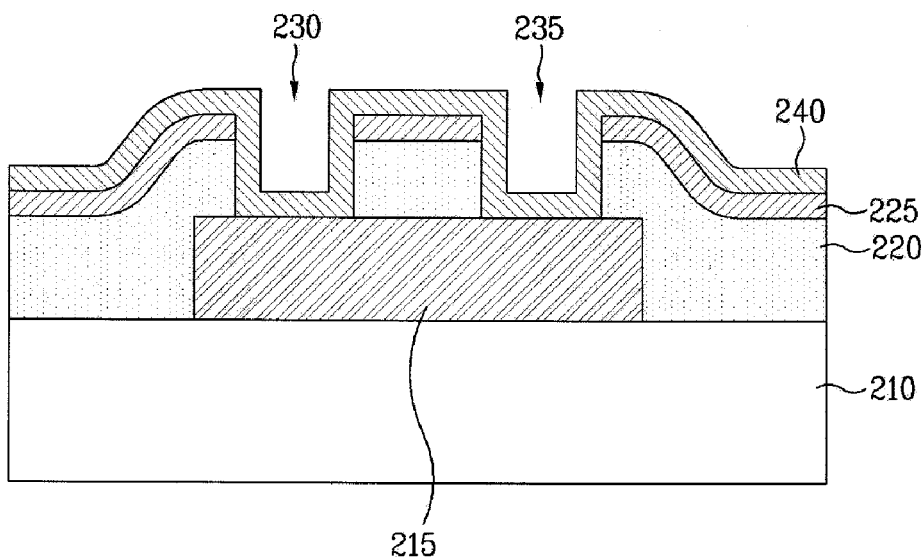

Referring to example FIG. 2E, a seed layer 240 is formed over the pre-metal-dielectric 220/225 having the at least one via hole 230 and/or 235 formed therein. The seed layer 240 may be formed in the via hole 230 and/or 235. For an example, a copper seed layer 240 may be formed by copper CVD (Chemical Vapor Deposition). A metal barrier layer may be deposited having at least one of Ta, TaN, TiW, and TiN stacked thereon for preventing metal from diffusing.

Figure 2F:
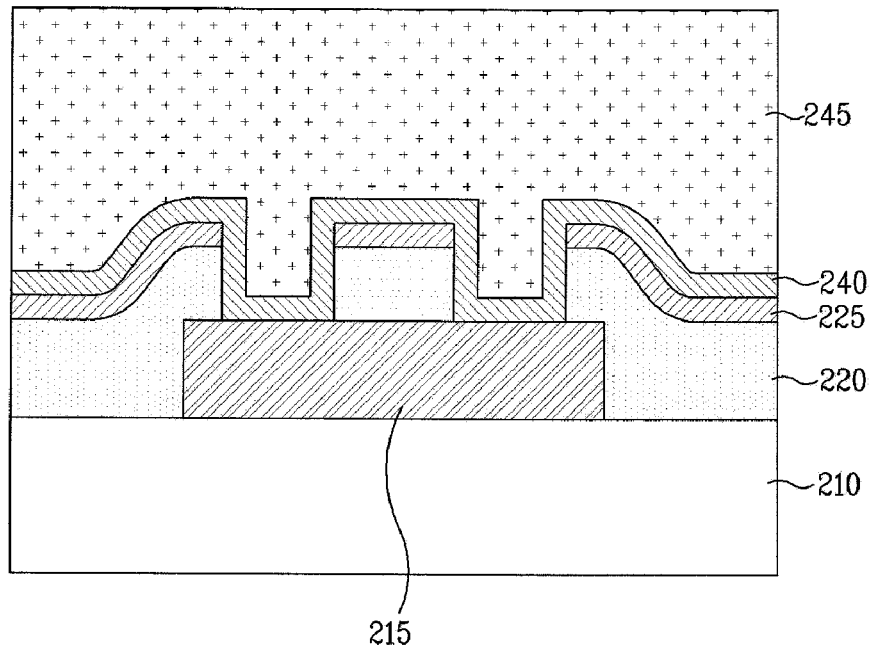

Next, as shown in example FIG. 2F, polyimide 245 may be coated over the semiconductor substrate 210 having the seed layer 240 formed thereon to fill the via hole 230 and/or 235. The polyimide may have a thickness greater than 10 μm.

Figure 2G:
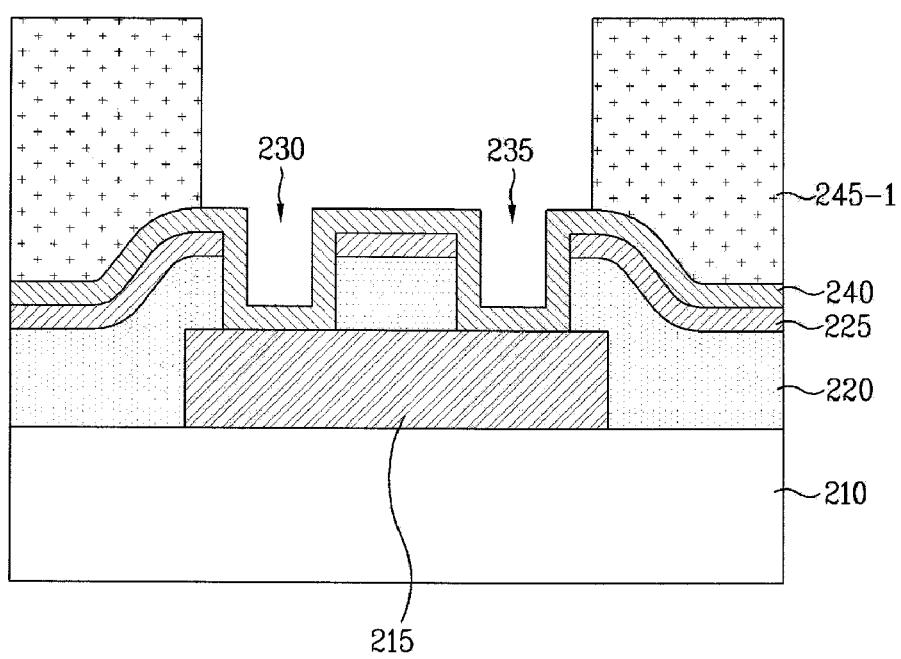

Referring to example FIG. 2G, the polyimide 245 may be etched selectively to expose a portion of the seed layer 225 opposite to the buffer lower metal line 215. The polyimide 245-1 etched thus can expose the via hole 230 and/or 235 and the seed layer 240 in the vicinity of the via hole 230 and/or 235.

For an example, the polyimide 245 may be subjected to photolithography to form a photoresist pattern. The photoresist pattern may expose a polyimide region 245 of the via hole 230 and/or 235 and the seed layer 240 in the vicinity of the via hole 230 and/or 235. Then, the polyimide 245 may be etched until the seed layer 240 is exposed by using the photoresist pattern as an etch mask.

Figure 2H:
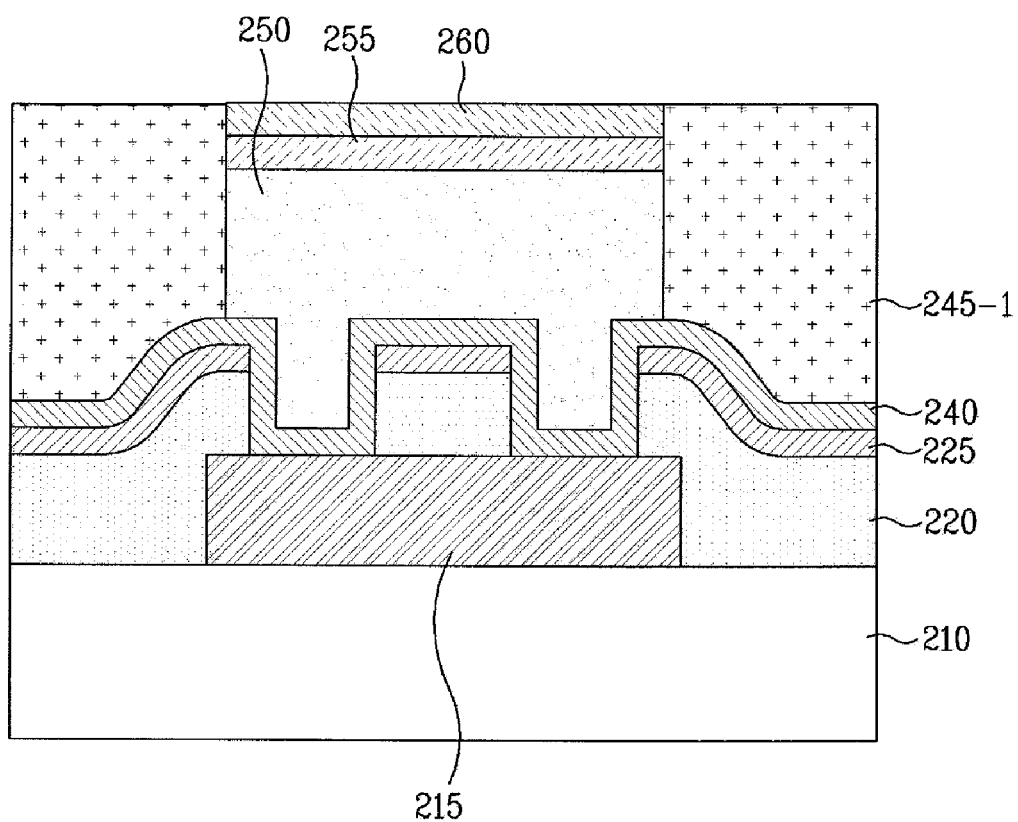

Referring to example FIG. 2H, an upper metal line 250 may be formed over the exposed seed layer 240 in the etched polyimide 245-1. For an example, a copper layer 250 can be formed over the copper seed layer 240 by copper electroplating. The copper layer 250 may be formed to have a thickness greater than 10 μm.

Then, an interface metal layer 262 may be formed over the copper layer 250 formed in the polyimide 245-1 etch thus. The interface layer 262 may be a stack of at least one of Ni, Pd and Au. For an example, an Ni layer 255 may be formed over the copper layer 250, and any one layer 260 of Pd and Au may be formed over the Ni layer 255.

Figure 2I:
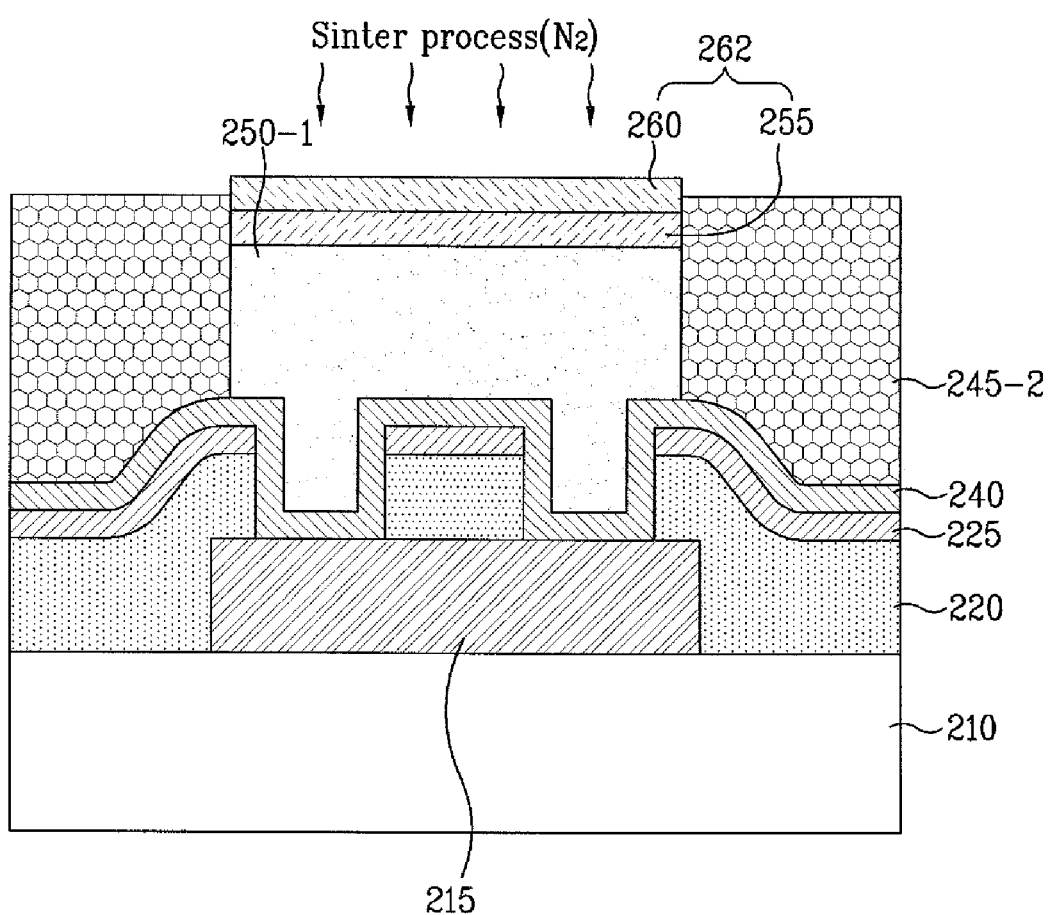

Referring to example FIG. 2I, a sintering may be performed at 300~400° C. using $N_2$ gas. Since polyimide has a better thermal property than photoresist, the sintering at 300~400° C. can be performed easily. That is, the sintering at 300~400° C. can improve physical and thermal stability of the polyimide 245-2.

Figure 2J:
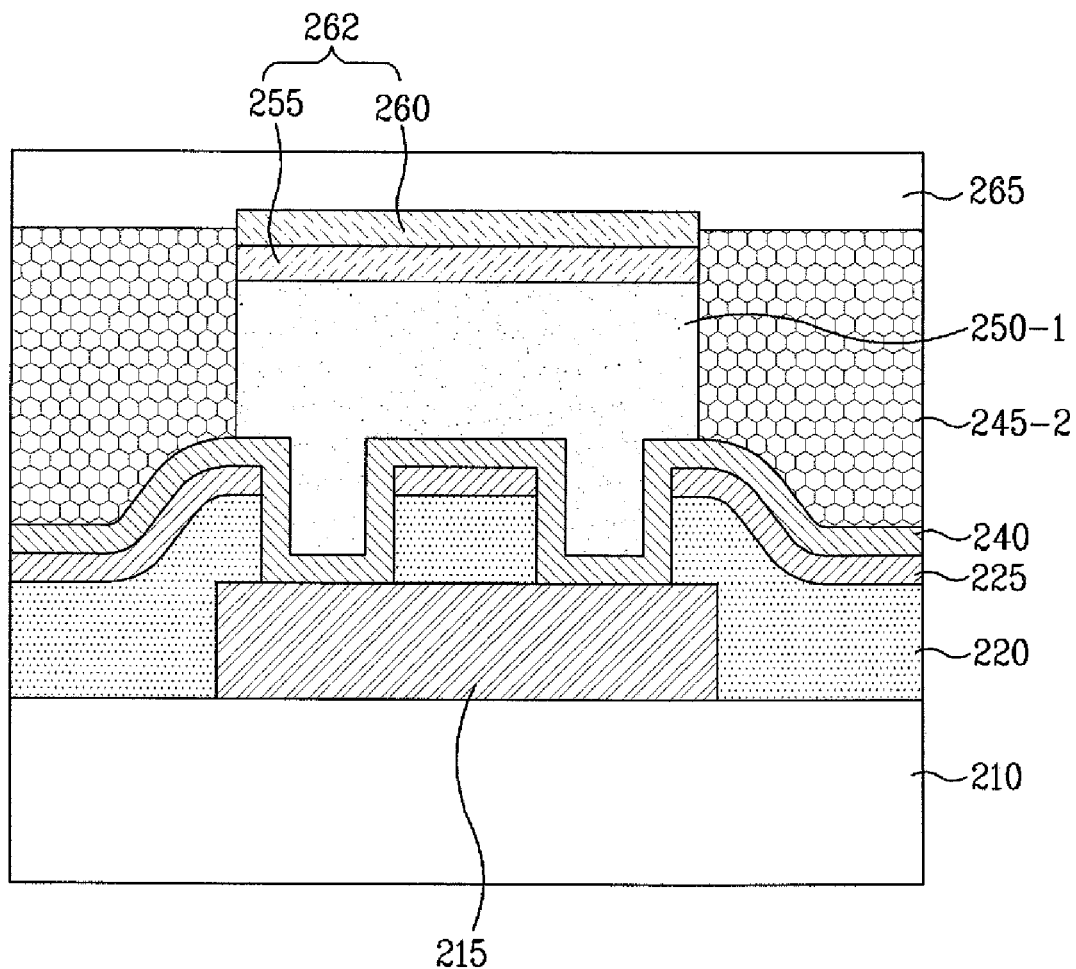

Referring to example FIG. 2J, a taping layer 265 may be formed over the polyimide 245-2 having physical and thermal stability improved by the sintering for back grinding. Then, back grinding may be performed for grinding a rear surface of the semiconductor substrate 210 having the taping layer 265 stuck thereto. After the back grinding, the taping layer 265 may be removed.

Since the physical stability of the polyimide 245-2 is improved by sintering, no additional photoresist coat may be required. The taping layer 265 can be formed over the polyimide 245-2, directly.

Figure 2K:
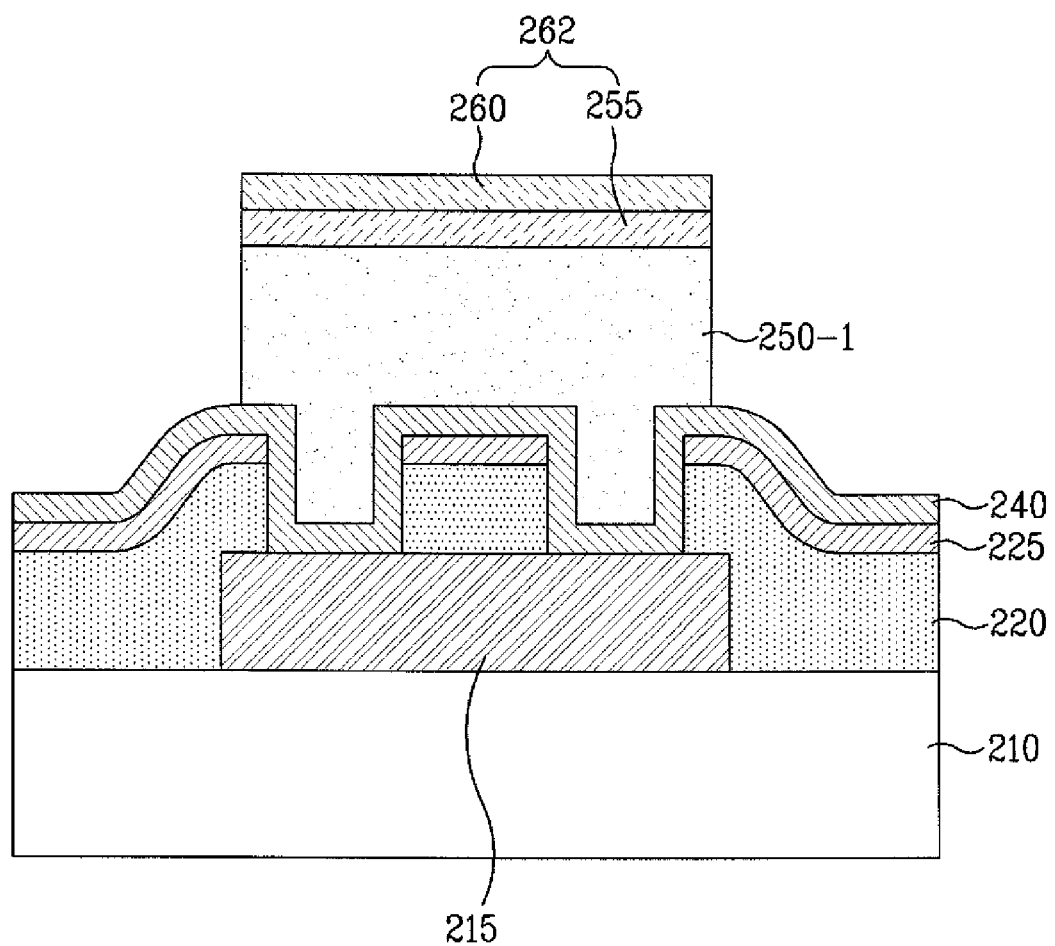

Referring to example FIG. 2K, the polyimide 245-2 and a portion of the seed layer 240 may be removed by dry and wet etchings. For an example, the polyimide 245-2 may be removed by dry etching using $O_2$ plasma, and the seed layer 240 exposed after removal of the polyimide 245-2 may be removed by wet etching using hydrochloric acid (HCl) or sulfuric acid.

Rather than removing the polyimide 245-2 and the seed layer 240 by wet etching, by removing the polyimide by dry etching and by removing the exposed seed layer by wet etching, a loss of a sidewall of the upper metal line 250-1, caused by wet etching, can be reduced.

Figure 2L:
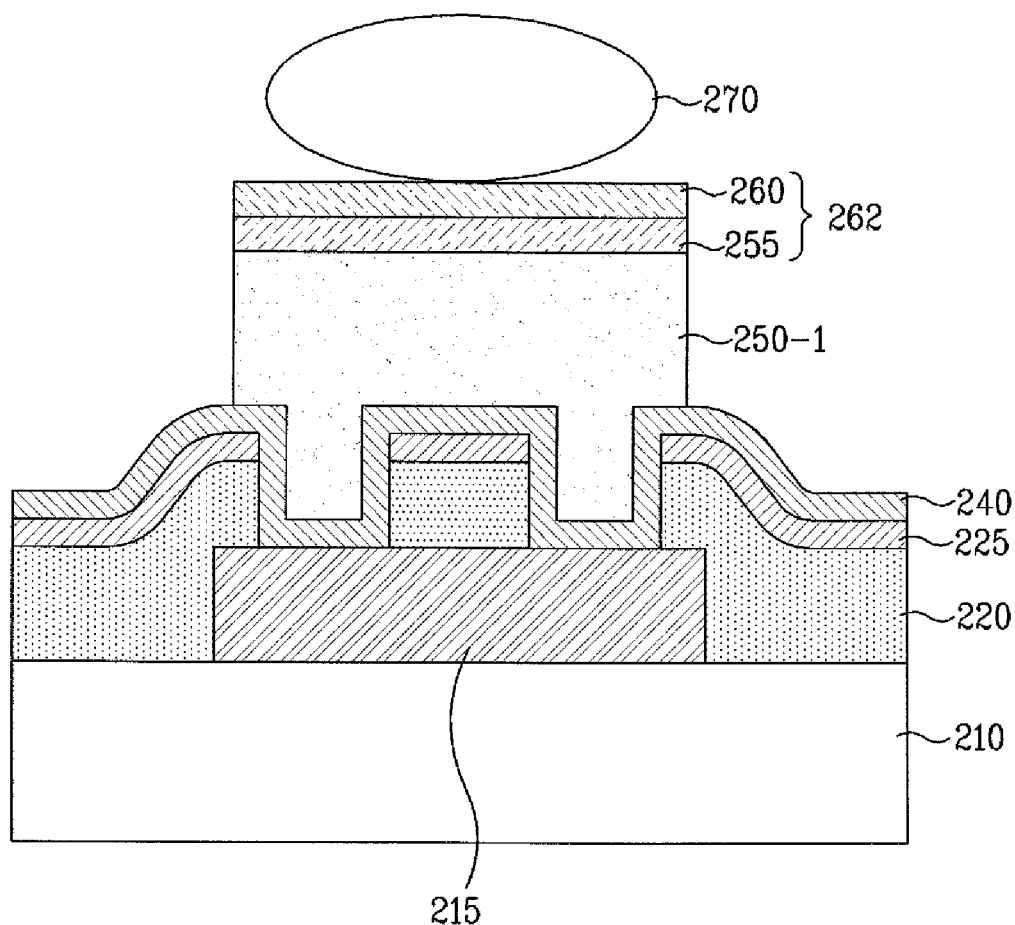

Referring to example FIG. 2L, a bonding portion 270 may be bonded onto the interface metal layer having a stack of the nickel layer 255 and one layer 260 of Pd and Au. In this instance, a physical impact caused by bonding of the bonding portion 270 may be transmitted to the copper layer 250 and the buffer lower metal line 215.

Referring to example FIG. 2A, in the method for forming a metal line in a high voltage semiconductor device in accordance with embodiments, both the lower metal line 215 and the upper metal line are relatively thick metal lines. For an example, the buffer lower metal line 215 may have a thickness of 1 μm~2 μm, and the upper metal line 250 may have a thickness of 10 μm~20 μm.

Since the physical impact caused by bonding of the bonding portion 270 is absorbed and attenuated by the buffer lower metal line 215, a circuit at the semiconductor substrate under the buffer lower metal line 215 can be protected. That is, the physical impact caused during bonding and transmitted to the circuit formed at the semiconductor substrate 210 under the buffer lower metal line 215 can be reduced. Moreover, the thick buffer lower metal line 215 reduces a resistance when a semiconductor device is switched on.

As has been described, the metal line in a semiconductor device and the method for forming the same according to embodiments has the following advantages. The Dual Thick Metal line formation in which both the lower metal line and the upper metal line may be formed with a relatively greater thickness than other layers in the fabrication of a high voltage semiconductor device permits reduced physical stresses transmitted to a circuit formed in the semiconductor substrate at the time of wire bonding, and reduces a resistance when a semiconductor device is switched on.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   a buffer lower metal line formed over a semiconductor substrate for absorbing an external impact, wherein the buffer lower metal line has a thickness of approximately 1 μm to 2 μm ;
   a pre-metal-dielectric layer which covers the buffer lower metal line, the pre-metal-dielectric layer having a via hole formed therein to expose a portion of the buffer lower metal line;
   a seed layer formed over a surface of the pre-metal-dielectric layer in the via hole and in the vicinity of the via hole;
   an upper metal line formed over the seed layer; and
   a bonding portion bonded onto the upper metal line.

2. The apparatus of claim 1, wherein the upper metal line includes:
   a copper layer formed over the seed layer.

3. The apparatus of claim 2, wherein the copper layer has a thickness of 10 μm~20 μm.

4. The apparatus of claim 2 wherein the upper metal line includes:
   a metal layer including at least one of Ni, Pd and Au formed over the copper layer.

5. The apparatus of claim 1, including a metal barrier layer for preventing metal from diffusing between the pre-metal-dielectric layer and the seed layer.

6. The apparatus of claim 5, wherein the metal barrier layer includes at least one of Ta, TaN, TiW, and TiN.

7. The apparatus of claim 1, wherein the pre-metal-dielectric layer includes:
   an oxide film; and
   a nitride film formed over the oxide film.

* * * * *